United States Patent
Kawaguchi et al.

(10) Patent No.: US 6,757,214 B2
(45) Date of Patent: Jun. 29, 2004

(54) SYNCHRONOUS TYPE SEMICONDUCTOR MEMORY DEVICE

(75) Inventors: Kazuaki Kawaguchi, Kawasaki (JP); Shigeo Ohshima, Yokohama (JP); Nobuo Watanabe, Yokohama (JP); Yoshinori Ogawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/443,439

(22) Filed: May 22, 2003

(65) Prior Publication Data

US 2003/0223293 A1 Dec. 4, 2003

(30) Foreign Application Priority Data

May 31, 2002 (JP) ....................................... 2002-159165

(51) Int. Cl.[7] ................................................. G11C 8/00
(52) U.S. Cl. ...................................... 365/233; 365/194
(58) Field of Search ................................. 365/233, 194, 365/233.5, 240, 189.12; 327/141, 152

(56) References Cited

U.S. PATENT DOCUMENTS

| | | | |
|---|---|---|---|
| 5,867,432 A | 2/1999 | Toda | ........................... 365/194 |
| 6,262,938 B1 | 7/2001 | Lee et al. | .................... 365/233 |
| 6,269,051 B1 * | 7/2001 | Funaba et al. | .............. 365/233 |
| 6,292,412 B1 * | 9/2001 | Kato et al. | ................... 365/194 |
| 6,545,941 B2 * | 4/2003 | Kato et al. | ................... 365/233 |

* cited by examiner

Primary Examiner—Vu A. Le
(74) Attorney, Agent, or Firm—Hogan & Hartson, LLP

(57) ABSTRACT

A synchronous type semiconductor device which inputs/outputs data with respect to a host includes a memory circuit, command decoder and CAS latency setting circuit. The command decoder decodes a command control signal input from the host in synchronism with a clock input from the host and outputs the decoded command to the memory circuit. The command includes a read command and mode register set command. The CAS latency setting circuit sets CAS latency in a read cycle based on a predetermined command output from the command decoder and a function control signal input from the host. The predetermined command is a command other than the mode register set command.

19 Claims, 8 Drawing Sheets

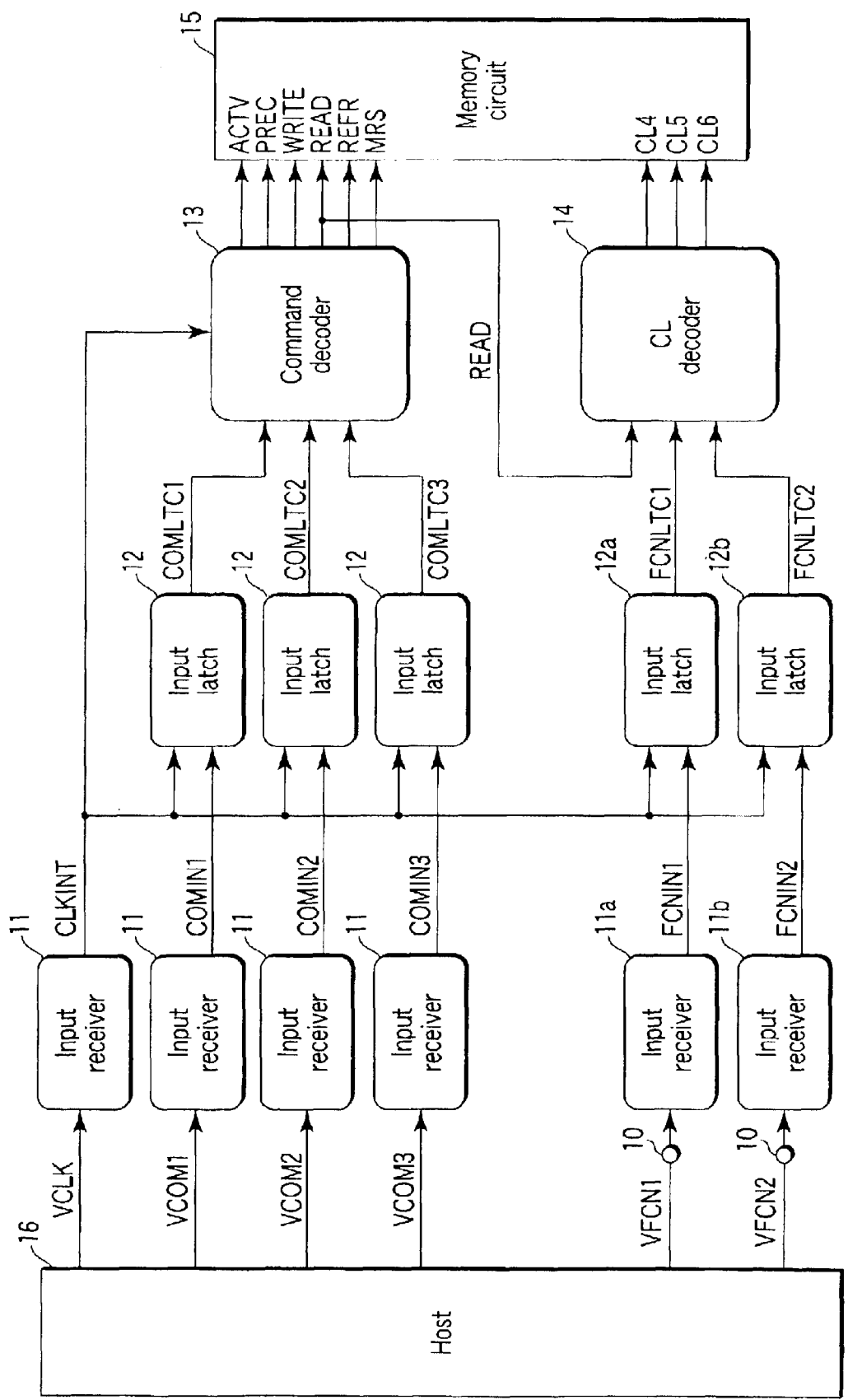
F I G. 1

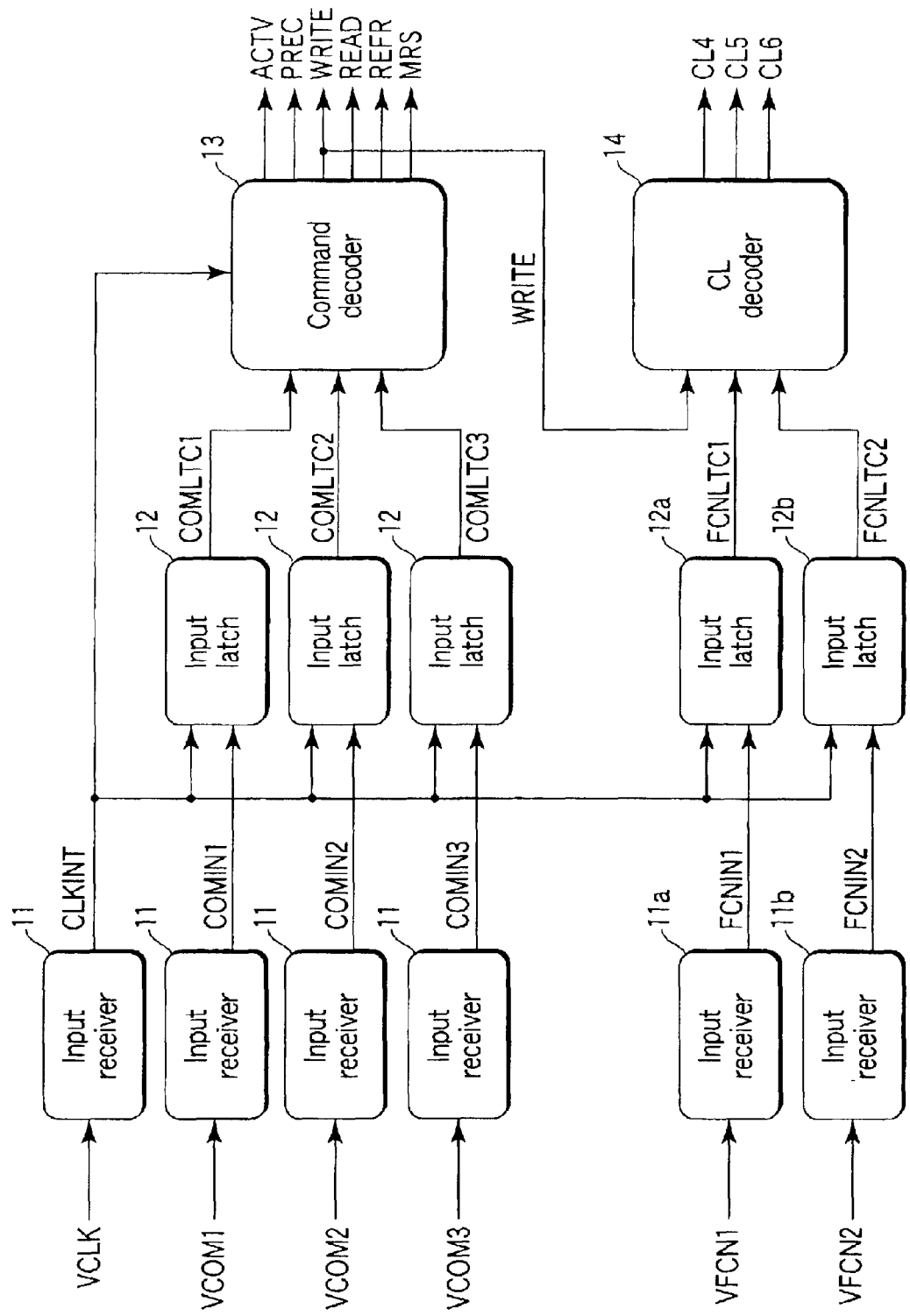
F I G. 2

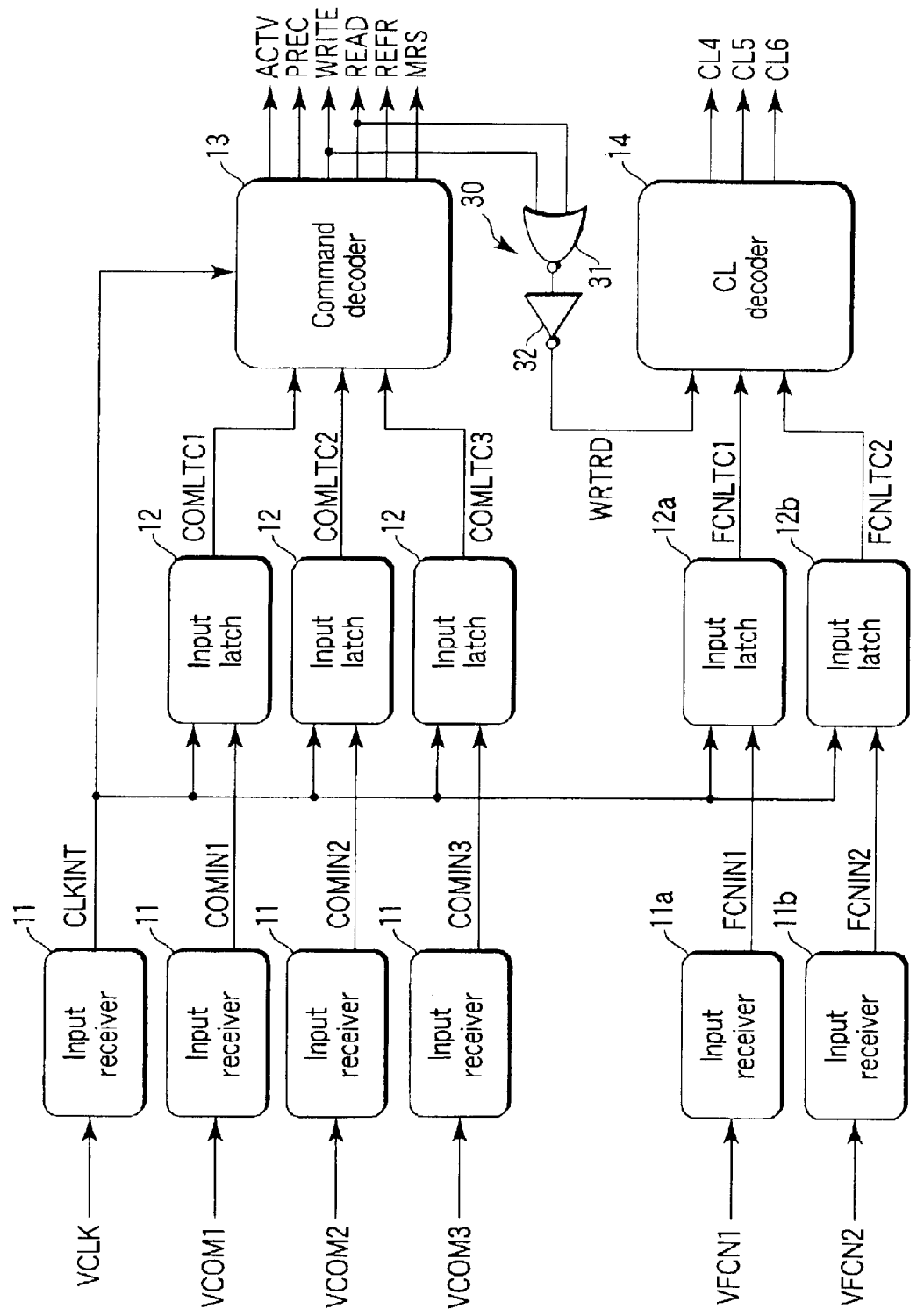
F I G. 3

| CL4 | PRECL5 | CL setting |
|---|---|---|
| 1 | 1 | CL4 |
| 0 | 1 | CL5 |
| 0 | 0 | CL6 |

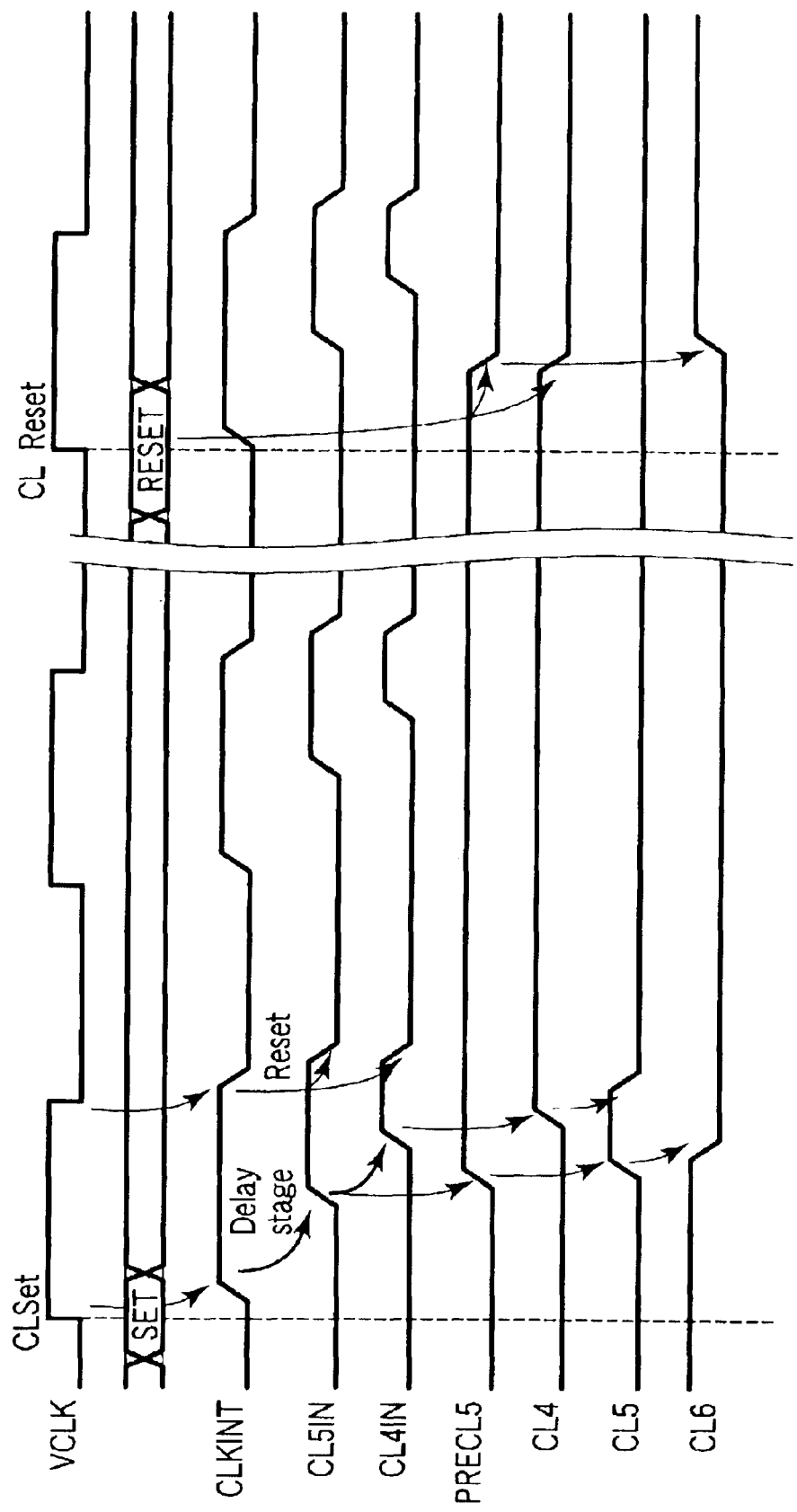

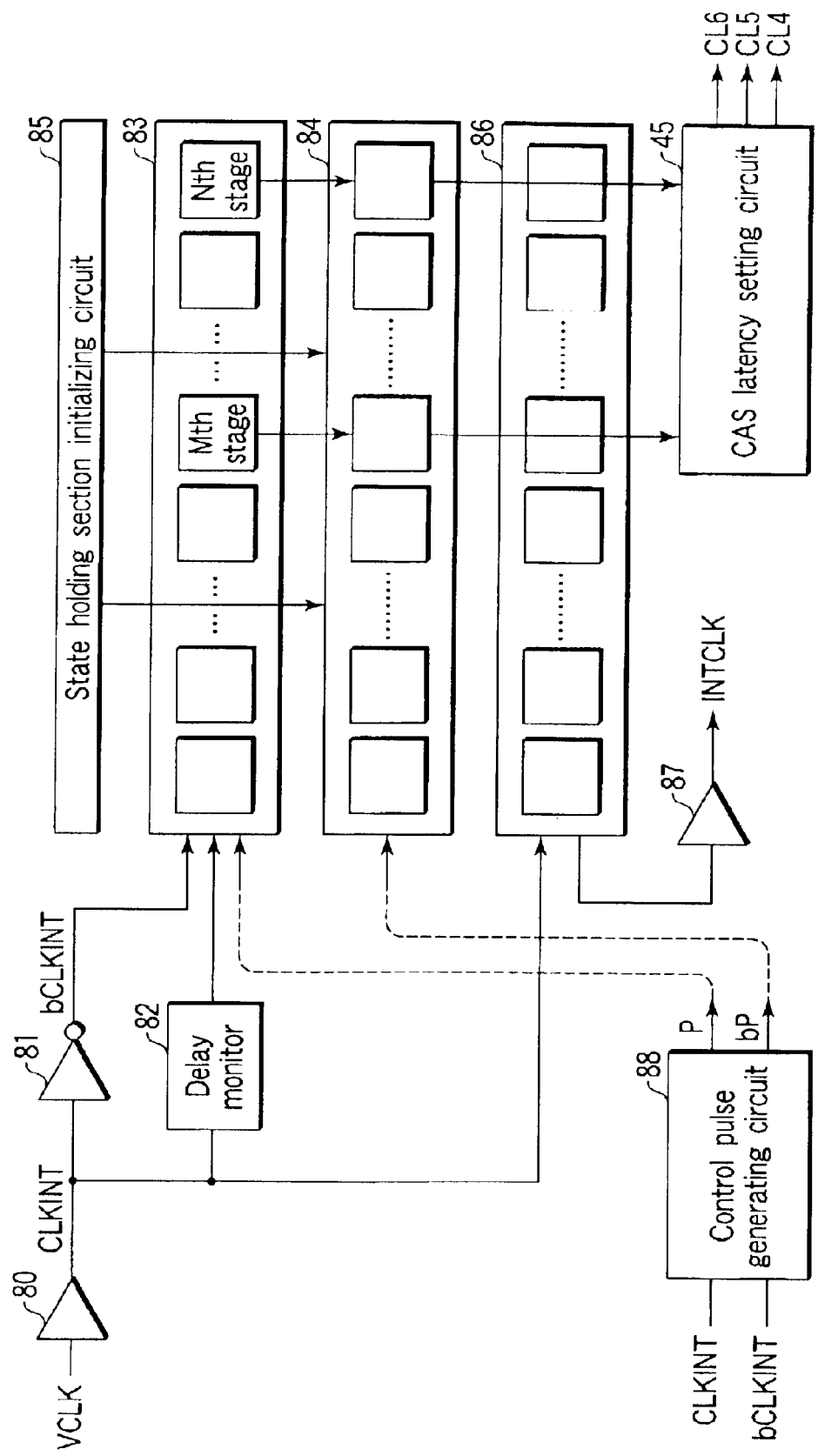
F I G. 8

SYNCHRONOUS TYPE SEMICONDUCTOR MEMORY DEVICE

CROSS-REFERENCE TO RELATED APPLICATIONS

This application is based upon and claims the benefit of priority from the prior Japanese Patent Application No. 2002-159165, filed May 31, 2002, the entire contents of which are incorporated herein by reference.

BACKGROUND OF THE INVENTION

1. Field of the Invention

This invention relates to a semiconductor memory device and more particularly to a switching circuit used to set CAS (Column Access Strobe) latency in a synchronous type semiconductor memory device in which a command is input and data is output in synchronism with a clock. For example, this invention is applied to a synchronous DRAM (SDRAM), fast cycle RAM (FCRAM), double data rate SDRAM (DDR-SDRAM), double data rate FCRAM (DDR-FCRAM) and the like.

2. Description of the Related Art

In recent years, as information technology (IT) has been developed in various fields, a demand for semiconductor memories has risen and a requirement for enhancement of the technical level, particularly, the operation speed of memories has become stronger.

In this trend, unlike an asynchronous memory (such as EDO) which is asynchronous with-respect to an external clock, a synchronous DRAM (SDRAM) in which a command is input and data is output in synchronism with an external clock has been proposed. The SDRAM is already put into practice in the generation of 4M/16M DRAM and the SDRAM occupies most part of all of the DRAMs used in the generation of 64M DRAM. Recently, in order to further enhance the operation speed of the SDRAM, a double data rate SDRAM (DDR-SDRAM) operated at a data rate which is twice that of the conventional case is proposed and will be dominantly used as the DRAM.

Further, a Fast Cycle RAM (FCRAM) of fast cycle which performs access operation and precharge operation to the core in a pipeline fashion to reduce tRC (access time) of the conventional SDRAM at least by half and a DDR-FCRAM in which the data rate is doubled have been proposed. FCRAMs will be commercialized in the network field in which random data is transferred at high speed while the router and LAN switch in which the conventional SRAMs have been used are mainly used.

In the above-described synchronous type semiconductor memory device, the number of clock cycles generated in a period from the time a read command is input until the time first data is output is defined by CAS latency (CL). For example, the CAS latency (CL) is set by inputting a mode register set command before the read cycle is started.

In the synchronous type semiconductor memory device, when the control operation is performed to switch CL for each read cycle, it is necessary to input the mode register set command without fail before the read cycle is performed. Therefore, the number of clock cycles is increased by one extra cycle.

Further, in the product such as an FCRAM which determines a command based on a combination of first and second commands, it cannot distinguish the mode register set command from the only first command. Therefore, in order to determine the mode register set command, it is necessary to increase the number of clock cycles by another extra cycle.

BRIEF SUMMARY OF THE INVENTION

A synchronous type semiconductor device according to a first aspect of the present invention which inputs/outputs data with respect to a host comprises a memory circuit, and a command decoder which decodes a command control signal input from the host in synchronism with a clock input from the host and outputs the decoded command to the memory circuit. The command includes a read command and mode register set command.

The synchronous type semiconductor device includes a CAS latency setting circuit which sets CAS latency in a read cycle based on a preset command output from the command decoder and a function control signal input from the host. The preset command is a command other than the mode register set command.

A synchronous type semiconductor device according to a second third aspect of the present invention which inputs/outputs data with respect to a host comprises a clock frequency detecting circuit which detects the frequency of a clock input from the host.

The synchronous type semiconductor device includes a CAS latency setting circuit which sets CAS latency based on the clock frequency detected by the clock frequency detecting circuit.

A synchronous type semiconductor device according to a third aspect of the present invention which inputs/outputs data with respect to a host comprises a clock phase control circuit which controls timing of a clock input from the host and an internal clock of the synchronous type semiconductor device and includes a forward pulse delay line and backward pulse delay line. Each of the forward pulse delay line and backward pulse delay line includes a plurality of delay circuits, which are connected in series, with the same configuration.

The synchronous type semiconductor device includes a CAS latency setting circuit which sets CAS latency based on delay output signals output from predetermined delay circuits in the delay circuits which one of the forward pulse delay line and backward pulse delay line includes.

BRIEF DESCRIPTION OF THE SEVERAL VIEWS OF THE DRAWING

FIG. 1 is a block circuit diagram showing a system which sets CAS latency (CL) in an FCRAM according to a first embodiment of the present invention;

FIG. 2 is a block circuit diagram showing a CL setting switching control section in an FCRAM according to a second embodiment of the present invention;

FIG. 3 is a block circuit diagram showing a CL setting switching control section in an FCRAM according to a third embodiment of the present invention;

FIG. 5 is a timing waveform diagram showing an example of the CL4 setting operation in the system shown in FIG. 4A;

FIG. 8 is a block circuit diagram showing one example in which a clock frequency detecting circuit in the system of FIG. 4A is also used as a forward pulse delay line of an STBD circuit.

DETAILED DESCRIPTION OF THE INVENTION

Figures 4A, 4B:
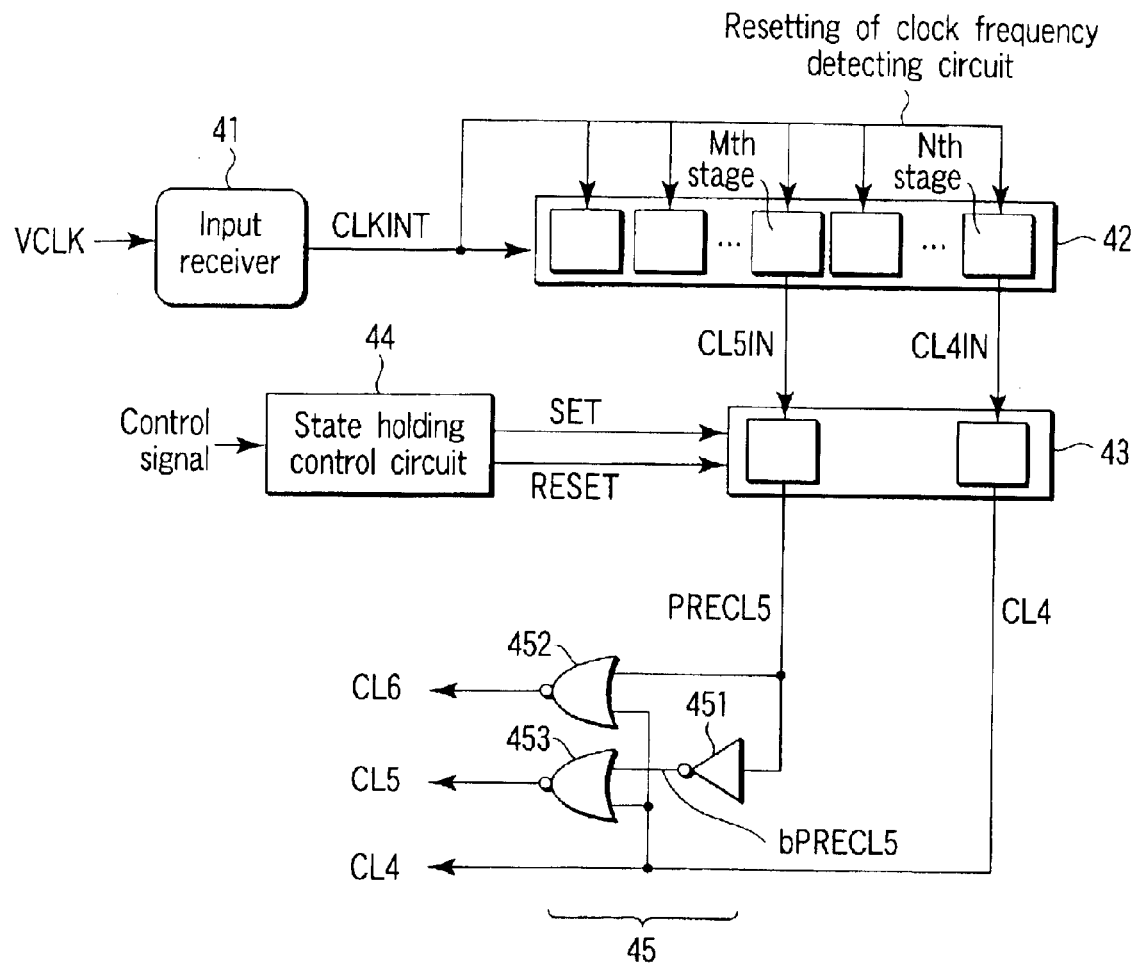
FIG. 4A is a block circuit diagram showing a CL setting switching control section in an FCRAM according to a fourth embodiment of the present invention.
FIG. 4B is a truth table which shows the operation of a logic circuit 45 in the FCRAM shown in FIG. 4A.

There will now be described embodiments of this invention with reference to the accompanying drawings.

This invention is applied to an SDRAM, FCRAM, DDR-SDRAM, DDR-FCRAM and the like each of which utilizes a system used to set CAS latency (CL) in the read cycle in a synchronous type semiconductor memory device having a synchronous type semiconductor memory circuit.

<First Embodiment>

FIG. 1 shows a system which sets CL in an FCRAM according to a first embodiment of the present invention.

A synchronous type semiconductor memory device is connected to a host 16 via a plurality of signal lines. An external clock VCLK and various control signals are input from the host 16 via the signal lines.

The synchronous type semiconductor memory device includes a plurality of input receivers 11, a plurality of input latches 12, a command decoder 13, a CL decoder 14 and a memory circuit 15.

Further, the semiconductor memory device includes function pins 10, input receivers 11a, 11b and input latches 12a, 12b in order to set CL for each read command.

External function control signals VFCN1, VFCN2 which are used for setting CL are supplied from the host 16 to the semiconductor memory device. The external function control signals VFCN1, VFCN2 are input the function pins 10.

The input receivers 11 contain a circuit which outputs an internal clock CLKINT in response to the external clock VCLK supplied from the host 16 and circuits which respectively output internal command control signals COMIN1, COMIN2, COMIN3 in response to external command control signals VCOM1, VCOM2, VCOM3 supplied from the host 16.

The input receivers 11a, 11b respectively output internal function control signals CNIN1, CNIN2 in response to the external function control signals VFCN1, VFCN2 supplied from the host 16.

The input latches 12 receive the signals COMIN1, COMIN2, COMIN3 and CLKINT and respectively output command control latch signals COMLTC1, COMLTC2, COMLTC3 based on the internal clock CLKINT.

The input latches 12a, 12b receive the signals FCNIN1, FCNIN2 and CLKINT and respectively output function latch signals FCNLTC1, FCNLTC2 based on the internal clock CLKINT.

The command decoder 13 receives the signals COMLTC1, COMLTC2, COMLTC3 and CLKINT and outputs various commands such as a bank active command (ACTV), bank precharge command (PREC), write command (WRITE), read command (READ), refresh command (REFR) and mode register set command (MRS). The bank active command (ACTV) is a command to select a ROW address. The bank precharge command (PREC) is a command to reset the selected ROW address. The above various commands are stored in the memory circuit 15.

The CL decoder 14 receives the signals FCNLTC1, FCNLTC2 and read command (READ) and determines CL. Then, the CL decoder 14 outputs various CL control signals (CL4, CL5, CL6). The CL control signals are supplied to the memory circuit 15.

The synchronous type semiconductor memory device is set into the read cycle when receiving a desired combination of "H" and "L" levels of the external command control signals VCOM1, VCOM2, VCOM3. Then, the command decoder 13 outputs the "H" level of a read command (READ). The read command (READ) is input to the CL decoder 14. At the same time, the CL decoder 14 determines CL and sets a desired CL control signal (in this example, one of the control signals CL4, CL5, CL6) to "H" when the synchronous type semiconductor memory device receives a desired combination of the "H" and "L" levels of the external function control signals VFCN1, VFCN2. As a result, it becomes possible to set CL for each read cycle without using the mode register set command, and therefore, CL can be switched at high speed.

In the first embodiment, an example in which CL is set for each read cycle is explained. However, for example, in the FCRAM, a period from the time a read command is input until the time first data is output in the read cycle is short. Therefore, as a method of setting CL for the read cycle previously, a change is made so as to use a command other than the mode register set command MRS and read command READ output from the command decoder 13 in the read cycle. As a result, the CL setting operation can be previously performed for the next read cycle. A second embodiment in which the above change is made is explained below.

<Second Embodiment>

FIG. 2 shows a CL setting switching control section in an FCRAM according to the second embodiment of the present invention.

The system shown in FIG. 2 is configured to set CL for each write command. In comparison with the system of the first embodiment, the system of the second embodiment is changed so that a CL decoder 14 can determine CL in response to a desired combination of the "H" and "L" levels of external function control signals VFCN1, VFCN2 and a write command WRITE output from a command decoder 13. Since the configurations of a host 16 and memory circuit 15 are the same as those of the first embodiment, they are omitted in the drawing. In addition, portions which are the same as those of FIG. 1 are denoted by the same reference symbols and the detail of explanation thereof is omitted.

The system is set into the write cycle when receiving a desired combination of the "H" and "L" levels of the external command control signals VCOM1, VCOM2, VCOM3. Then, the command decoder 13 outputs "H" of a write command WRITE. The write command WRITE is input to the CL decoder 14. At the same time, the CL decoder 14 determines CL and sets a desired CL control signal (in this example, one of the control signals CL4, CL5, CL6) to "H" when receiving a desired combination of the "H" and "L" levels of the external function control signals VFCN1, VFCN2. As a result, it becomes possible to set CL for each write cycle.

In the second embodiment, the CL setting at the time of each command input can be switched by changing the write command WRITE with one of the bank active command (ACTV), bank precharge command (PREC) and refresh command (REFR).

Further, commands used to switch the CL setting are not limited to the above commands and commands other than the read command READ and mode register set command MRS can be applied in the same manner.

In the first and second embodiments described above, an example in which the CL setting for the read cycle is made for each read command READ output from the command decoder 14 or for each desired command other than the mode register set command MRS and read command READ is explained. However, it is also possible to make a change so as to set CL each time a desired command other than the mode register set command is input. A third embodiment in which the above change is made is explained below.

<Third Embodiment>

FIG. 3 shows a CL setting switching control section in an FCRAM according to the third embodiment of the present invention.

The system shown in FIG. 3 is configured to set CL for each read command and write command. In comparison with the system of the first embodiment, the system of the third embodiment is changed so that a two-input OR circuit 30 (which is configured by a two-input NOR circuit 31 and an inverter 32) which is supplied with a read command READ and write command WRITE output from a command decoder 13 will be newly provided. Further, a CL decoder 14 is changed to determine CL and output "H" of a desired CL signal (for example, CL4, CL5, CL6) when receiving a desired combination of "H" and "L" levels of external function control signals VFCN1, VFCN2 and an output (WRTRD) of the two-input OR circuit 30. In addition, portions which are the same as those of FIG. 1 are denoted by the same reference symbols and the detail of explanation thereof is omitted.

The system is set into the read cycle or write cycle when receiving a desired combination of the "H" and "L" levels of the external command control signals VCOM1, VCOM2, VCOM3. Then, the command decoder 13 outputs the "H" level of the command READ or WRITE. The command READ or WRITE is input to the OR circuit 30. As a result, the output (WRTRD) of the OR circuit 30 is set to the "H" level. At the same time, the CL decoder 14 determines CL and sets a desired CL control signal (in this example, one of the control signals CL4, CL5, CL6) to "H" when the system receives a desired combination of the "H" and "L" levels of the external function control signals VFCN1, VFCN2. As a result, it becomes possible to set CL for each read cycle or write cycle.

In the third embodiment, switching of the CL setting by use of desired two commands can be attained by changing the inputs of the two-input OR circuit 30 with commands other than the read command READ and write command WRITE.

Further, switching of the CL setting by use of desired three or four commands can be attained by changing the two-input OR circuit 30 with a three-input OR circuit or four-input OR circuit.

In the first to third embodiments, a case wherein timing of switching of the CL setting by use of the external input is set at the same time that a command (such as a read command) other than the mode register set command is set is explained. However, a change can be made to adequately switch the CL setting corresponding to a clock frequency without using the mode register set command MRS and external function pins. A fourth embodiment in which the above change is made is explained below.

<Fourth Embodiment>

FIG. 4A shows a CL setting switching control section in an FCRAM according to the fourth embodiment of the present invention.

A system shown in FIG. 4A includes an input receiver 41, clock frequency detecting circuit 42, state holding circuit 43, state holding control circuit 44 and logic circuit (CAS latency setting circuit) 45.

The input receiver 41 outputs an internal clock CLKINT in response to the external clock VCLK supplied from the host 16.

The clock frequency detecting circuit 42 receives the internal clock CLKINT and detects the clock frequency. In this example, the clock frequency detecting circuit 42 includes plural stages of delay circuits, which are connected in series, each having the same configuration. The clock frequency detecting circuit 42 outputs an Nth-stage delay signal CL4IN and Mth-stage delay signal CL5IN in response to the signal CLKINT. In this case, N>M.

The state holding circuit 43 receives the signals CL4IN and CL5IN and outputs and holds a signal CL4 and signal PRECL5.

The state holding control circuit 44 receives a hold control signal supplied from the host 16 such as a command and outputs a set signal (SET) and reset signal (RESET) to control the state holding circuit 43.

The logic circuit 45 performs the logical process of holding outputs of a plurality of delay signals of the clock frequency detecting circuit 42 to generate a CL setting switching signal. In this example, the logic circuit 45 includes an inverter circuit 451 which receives the signal PRECL5 and outputs a signal bPRECL5, a two-input NOR circuit 452 which receives the signal PRECL5 and signal CL4 and outputs a signal CL6, and a two-input NOR circuit 453 which receives the signal bPRECL5 and signal CL4 and outputs a signal CL5, and performs the switching control operation of the signals CL4, CL5, CL6.

FIG. 4B is a truth table which shows the operation of the logic circuit 45 shown in FIG. 4A.

By using the system, the signal CL4 which causes the period to outputting of first data to be shortest is set when the clock frequency is low, the signal CL5 is set when the clock frequency is intermediate, and the signal CL6 which causes the period to outputting of first data to be longest is set when the clock frequency is high.

That is, it is possible to detect the clock frequency which the user selectively uses in the range defined by the specification in the semiconductor chip and automatically change the period of the CAS latency in response to the clock frequency.

FIG. 5 shows an example of the operation at the CL4 setting time in the system shown in FIG. 4A.

When a propagation signal propagates along the delay stages of the clock frequency detecting circuit 42 in response to the internal clock signal CLKINT, it propagates to the Nth delay stage in the case of low frequency. As a result, both of the signals CL4IN and CL5IN are set to "H", the state is held in the state holding circuit 43, and both of the signals PRECL5 and CL4 are set to "H". Thus, the logic circuit 45 selects the signal CL4 in response to the signals PRECL5 and CL4 and sets the signals CL6, CL5 into the non-selected state.

Figure 6:
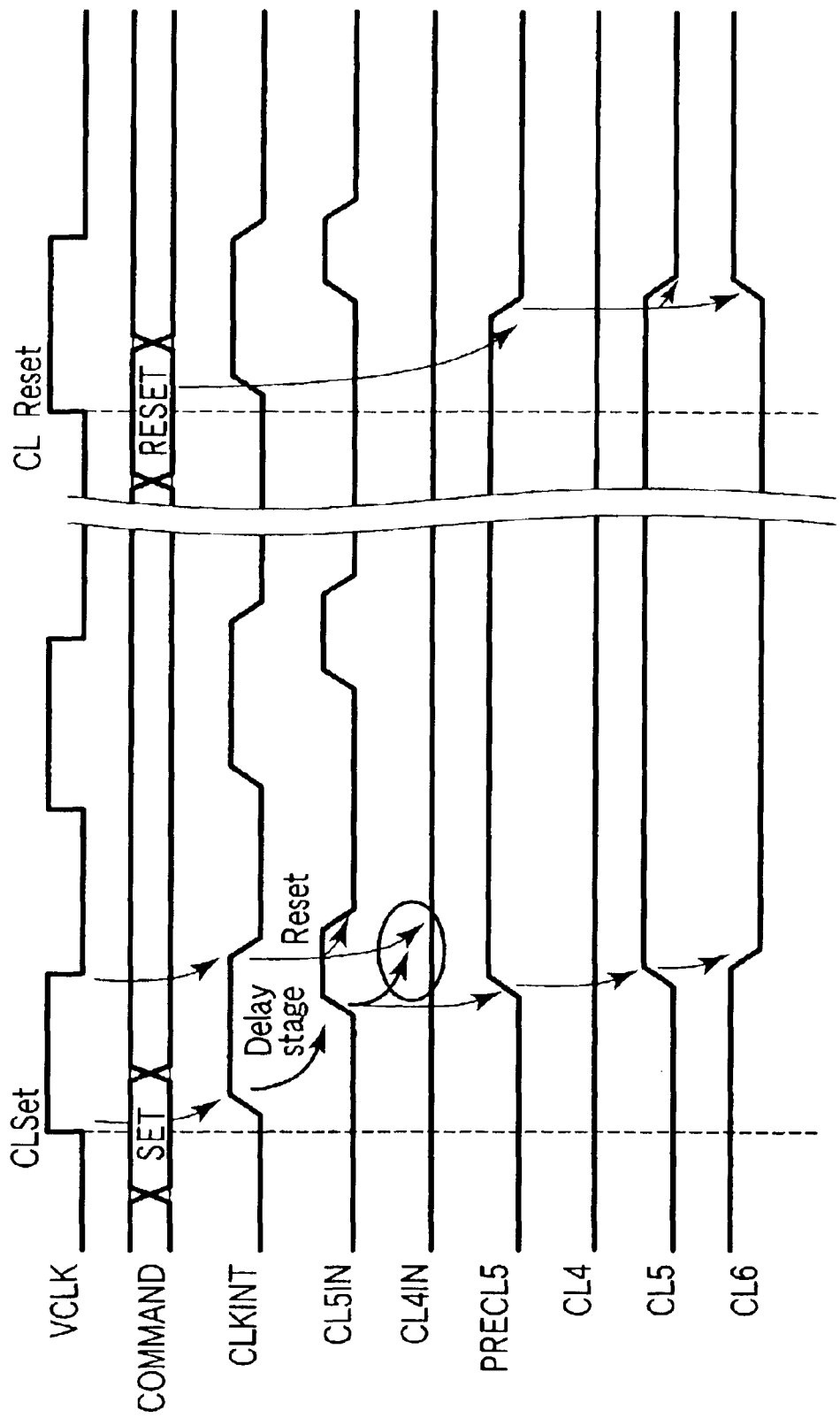
FIG. 6 is a timing waveform diagram showing an example of the CL5 setting operation in the system shown in FIG. 4A.

FIG. 6 shows an example of the operation at the CL5 setting time in the system shown in FIG. 4A.

When a propagation signal propagates along the delay stages of the clock frequency detecting circuit 42 in response to the internal clock signal CLKINT, it propagates to the Mth delay stage in the case of intermediate frequency, but it does not propagate to the Nth delay stage. As a result, the signal CL5IN and CL4IN are respectively set to "H" and "L", the state is held in the state holding circuit 43, and the signals PRECL5 and CL4 are respectively set to "H" and "L". Thus, the logic circuit 45 selects the signal CL5 in response to the signals PRECL5 and CL4 and sets the signals CL6, CL4 into the non-selected state.

Figure 7:
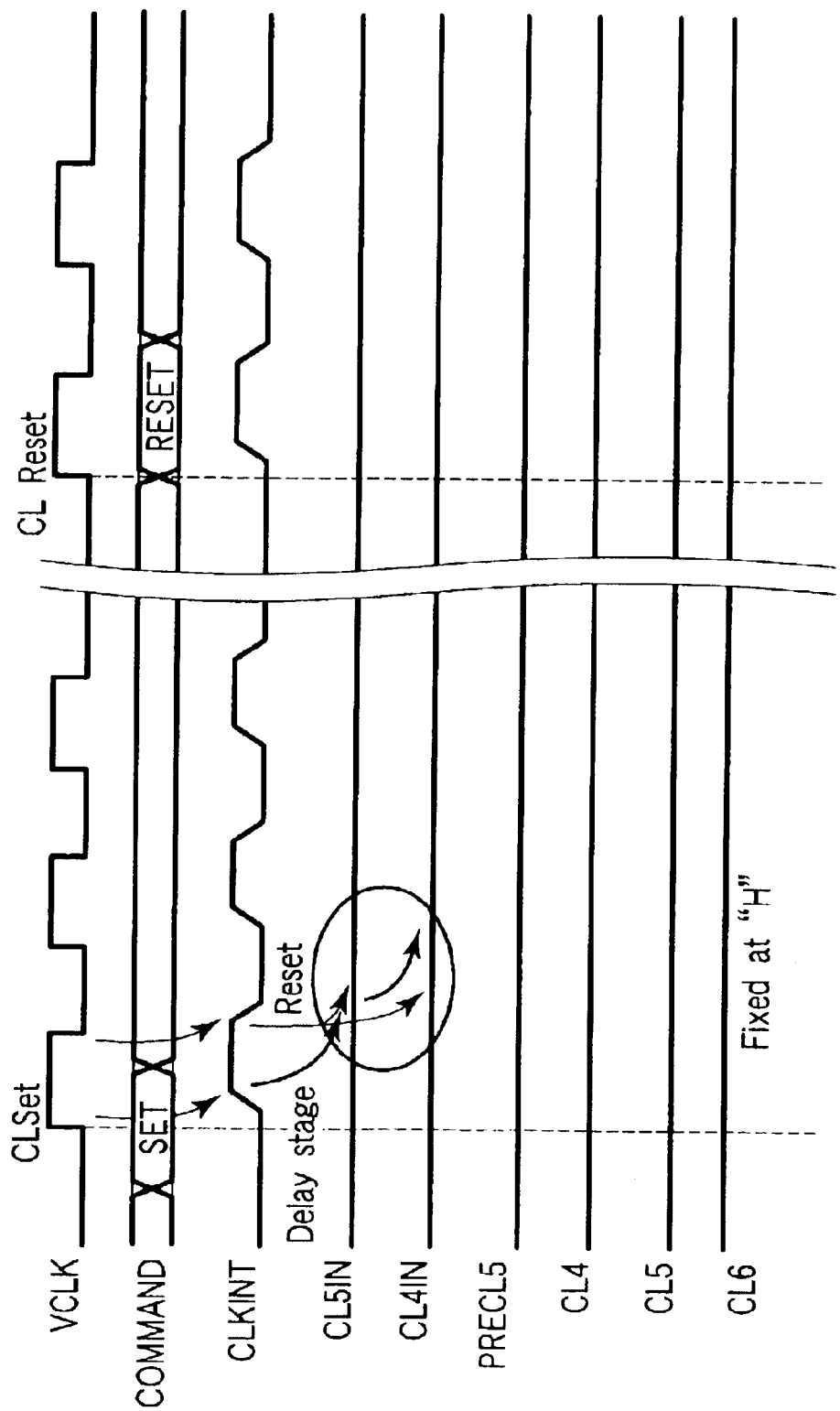
FIG. 7 is a timing waveform diagram showing an example of the CL6 setting operation in the system shown in FIG. 4A.

FIG. 7 shows an example of the operation at the CL6 setting time in the system shown in FIG. 4A.

When a propagation signal propagates along the delay stages of the clock frequency detecting circuit 42 in response to the internal clock signal CLKINT, it does not propagate to the Mth delay stage in the case of high frequency. As a result, both of the signals CL5IN and CL4IN are set to "L", the state is held in the state holding circuit 43, and both of the signals PRECL5 and CL4 are set to "L". Thus, the logic circuit 45 selects the signal CL6 in response to the signals PRECL5 and CL4 and sets the signals CL5, CL4 into the non-selected state.

During the above operation, the state holding control circuit 44 outputs a set signal (SET) or reset signal (RESET) on the basis of the hold control signal supplied from the host 16 at adequate timing. The clock frequency detecting circuit 42 is reset at adequate timing. Further, the state holding circuit 43 is reset on the basis of the set signal (SET) or reset signal (RESET) at adequate timing after the CL switching operation is performed.

In this case, the clock frequency detecting circuit 42 in the system of FIG. 4A can also be used as part of a clock phase control circuit which is mounted on the semiconductor device to control timings of the external clock and internal clock. For example, an example in which the clock frequency detecting circuit 42 is used as part of an STBD (Synchronous Traced Backwards Delay) circuit which is disclosed in U.S. Pat. No. 5,867,432 is explained below.

FIG. 8 is a block circuit diagram showing one example in which the clock frequency detecting circuit 42 in the system of FIG. 4A is also used as a forward pulse delay line of the STBD circuit.

The circuit shown in FIG. 8 includes a receiver 80, inverter circuit 81, delay monitor 82, forward pulse delay line 83, state holding section 84, state holding section initializing circuit 85, backward pulse delay line 86, driver 87, control pulse generating circuit 88, and the logic circuit (CAS latency setting circuit) 45.

The STBD circuit controls timing of an external clock VCLK supplied from the host 16 and an internal clock INTCLK of the synchronous type semiconductor memory device. The forward pulse delay line 83 and backward pulse delay line 86 are configured by a plurality of delay circuits, respectively. The delay circuits are connected in series. The state holding section 84 is configured by a plurality of latch circuits. The state holding section initializing circuit 85 makes switching between setting and resetting of the state holding section 84.

The system shown in FIG. 4A can be easily attained by using the forward pulse delay line 83 and state holding section 84 as the clock frequency detecting circuit 42 and state holding circuit 43 in the system of FIG. 4A. Further, an increase in the size of the circuit can be suppressed. In addition, it is also possible to use the state holding section initializing circuit 85 in FIG. 8 as the state holding control circuit 44 in the system of FIG. 4A.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A synchronous type semiconductor device which inputs/outputs data with respect to a host comprising:
    a memory circuit;
    a command decoder which decodes a command control signal input from the host in synchronism with a clock input from the host and outputs the decoded command to the memory circuit, the command including a read command and mode register set command; and
    a CAS latency setting circuit which sets CAS latency in a read cycle based on a predetermined command output from the command decoder and a function control signal input from the host, the predetermined command being a command other than the mode register set command.

2. The device according to claim 1, wherein the predetermined command is the read command.

3. The device according to claim 1, which further comprises a function pin used to input the function control signal and in which the CAS latency setting circuit sets the CAS latency based on the function control signal input to the function pin.

4. The device according to claim 1, further comprising a first latch circuit which outputs the command control signal input from the host to the command decoder in synchronism with the clock.

5. The device according to claim 1, further comprising a second latch circuit which outputs the function control signal to the CAS latency setting circuit in synchronism with the clock.

6. The device according to claim 1, wherein the CAS latency setting circuit sets CAS latency in a next read cycle based on the function control signal and predetermined command and the predetermined command is a command other than the read command and mode register set command.

7. The device according to claim 6, wherein the predetermined command is a write command (WRITE).

8. The device according to claim 6, wherein the predetermined command is one of a bank active command (ACTV), bank precharge command (PREC) and refresh command (REFR).

9. The device according to claim 1, wherein the CAS latency setting circuit sets CAS latency in the read cycle based on a plurality of commands output from the command decoder and the function control signal input from the host and the plurality of commands do not contain the mode register set command.

10. The device according to claim 9, which further comprises a function pin used to input the function control signal and in which the CAS latency setting circuit sets the CAS latency based on the function control signal input to the function pin.

11. A synchronous type semiconductor device which inputs/outputs data with respect to a host comprising:
    a clock frequency detecting circuit which detects a frequency of a clock input from the host; and
    a CAS latency setting circuit which sets CAS latency based on the clock frequency detected by the clock frequency detecting circuit.

12. The device according to claim 11, wherein the clock frequency detecting circuit includes a plurality of delay circuits with the same configuration and in which the delay circuits are connected in series.

13. The device according to claim 12, wherein the CAS latency setting circuit sets the CAS latency based on delay output signals output from predetermined delay circuits in the delay circuits.

14. The device according to claim 13, further comprising a holding circuit which is connected between the clock frequency detecting circuit and the CAS latency setting circuit and holds the delay output signals.

15. The device according to claim 14, wherein the holding circuit makes switching between setting and resetting of the delay output signals based on a hold control signal input from the host.

16. The device according to claim 11, wherein the CAS latency setting circuit includes a logic circuit.

17. A synchronous type semiconductor device which inputs/outputs data with respect to a host comprising:

a clock phase control circuit which controls timing of a clock input from the host and an internal clock of the synchronous type semiconductor device and includes a forward pulse delay line and backward pulse delay line, the forward pulse delay line and backward pulse delay line each of which includes a plurality of delay circuits with the same configuration, the delay circuits being connected in series; and a CAS latency setting circuit which sets CAS latency based on delay output signals output from predetermined delay circuits in the delay circuits which one of the forward pulse delay line and backward pulse delay line includes.

18. The device according to claim 17, wherein the clock phase control circuit further comprises a holding circuit which holds the delay output signals.

19. The device according to claim 18, further comprising a initializing circuit which resets the holding circuit.

* * * * *